(12) United States Patent
Liu et al.

(10) Patent No.: US 9,731,962 B2
(45) Date of Patent: Aug. 15, 2017

(54) MEMS DEVICE AND FABRICATION METHOD

(71) Applicant: Semiconductor Manufacturing International (Shanghai) Corporation, Shanghai (CN)

(72) Inventors: Xuanjie Liu, Shanghai (CN); Hongmei Xie, Shanghai (CN); Liangliang Guo, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/158,056

(22) Filed: May 18, 2016

(65) Prior Publication Data
US 2016/0264409 A1    Sep. 15, 2016

Related U.S. Application Data

(62) Division of application No. 14/314,703, filed on Jun. 25, 2014, now Pat. No. 9,371,223.

(30) Foreign Application Priority Data

Jun. 26, 2013    (CN) .......................... 2013 1 0261321

(51) Int. Cl.
*H01L 41/00*    (2013.01)
*B81C 1/00*    (2006.01)
(Continued)

(52) U.S. Cl.
CPC .......... *B81C 1/00246* (2013.01); *B81B 7/007* (2013.01); *H01L 41/0973* (2013.01);
(Continued)

(58) Field of Classification Search
None
See application file for complete search history.

(56) References Cited

U.S. PATENT DOCUMENTS 8,283,738 B2    10/2012  Fujii et al.
8,643,125 B2    2/2014   Chen
(Continued)

FOREIGN PATENT DOCUMENTS

CN    102718179 A    10/2012
CN    102874737 A    1/2013

*Primary Examiner* — Benjamin Sandvik
(74) *Attorney, Agent, or Firm* — Anova Law Group, PLLC

(57) ABSTRACT

MEMS devices and methods for forming the same are provided. A first metal interconnect structure is formed on a first semiconductor substrate to connect to a CMOS control circuit in the first semiconductor substrate. A bonding layer having a cavity is formed on the first metal interconnect structure, and then bonded with a second semiconductor substrate. A conductive plug passes through a first region of the second semiconductor substrate, through the bonding layer, and on the first metal interconnect structure. A second metal interconnect structure includes a first end formed on the first region of the second semiconductor substrate, and a second end connected to the conductive plug. Through-holes are disposed through a second region of the second semiconductor substrate and through a top portion of the bonded layer that is on the cavity to leave a movable electrode to form the MEMS device.

20 Claims, 7 Drawing Sheets

(51) Int. Cl.
*H01L 41/09* (2006.01)
*B81B 7/00* (2006.01)

(52) U.S. Cl.
CPC ... *B81B 2207/015* (2013.01); *B81B 2207/094* (2013.01); *B81C 2201/0132* (2013.01); *B81C 2201/0176* (2013.01); *B81C 2203/0109* (2013.01); *B81C 2203/036* (2013.01); *B81C 2203/0735* (2013.01); *B81C 2203/0771* (2013.01)

(56) References Cited

U.S. PATENT DOCUMENTS

| | | | |
|---|---|---|---|
| 8,866,238 B2 | 10/2014 | Classen | |
| 9,029,960 B2 | 5/2015 | Maruyama | |
| 2012/0049299 A1* | 3/2012 | Chou | B81C 1/00246 |
| | | | 257/417 |
| 2012/0098074 A1 | 4/2012 | Lin | |
| 2012/0223410 A1 | 9/2012 | Fujii | |
| 2012/0248615 A1 | 10/2012 | Chien | |
| 2013/0020718 A1* | 1/2013 | Chou | B81B 3/0018 |
| | | | 257/774 |
| 2013/0168740 A1 | 7/2013 | Chen | |

\* cited by examiner

MEMS DEVICE AND FABRICATION METHOD

CROSS REFERENCE TO RELATED APPLICATIONS

This application is a divisional of U.S. patent application Ser. No. 14/314,703, filed on Jun. 25, 2014, which claims priority to Chinese Patent Application No. CN201310261321.2, filed on Jun. 26, 2013, the entire content of all of which is incorporated herein by reference.

FIELD OF THE DISCLOSURE

The present disclosure relates to the field of semiconductor manufacturing technology and, more particularly, relates to MEMS (i.e., micro-electro-mechanical systems) devices and their fabrication methods.

BACKGROUND

In recent years, MEMS (i.e., micro-electro-mechanical systems) technology has been rapidly developed for designing, processing, manufacturing, testing, and control of materials in micro/nano size. A MEMS device is a microsystem formed by integrating mechanical components, optical systems and driver parts, with electronic control systems. MEMS technology is often used for manufacturing micro electro mechanical devices. These devices may include: a position sensor, a rotary engine, an inertial sensor, etc. The inertial sensor may include an acceleration sensor, a gyroscope, and a sound sensor.

Currently, a MEMS component is fabricated on a semiconductor substrate and a control circuit is fabricated on another semiconductor substrate by CMOS (complementary metal-oxide-semiconductor) technology. The control circuit and the MEMS device are then electrically connected by a lead frame to form a MEMS device. Thus, conventional MEMS device is formed using two semiconductor chips. This results in increasing manufacturing cost of the MEMS device. Typically, the semiconductor substrate having the control circuit thereon and the semiconductor substrate for forming the MEMS components are arranged in parallel within the lead frame. Therefore, conventional MEMS devices are large in size, which adversely affects degree of integration of the final deice and often fails to meet portability requirements for end use.

BRIEF SUMMARY OF THE DISCLOSURE

According to various embodiments, there is provided a method of forming a MEMS device. A first semiconductor substrate and a second semiconductor substrate are provided. The first semiconductor substrate includes a CMOS control circuit and the second semiconductor substrate includes a first region and a second region, the second region being between adjacent first regions. A first dielectric layer is formed on the first semiconductor substrate. A first metal interconnect structure is formed through the first dielectric layer, on the first semiconductor substrate, and connected to the CMOS control circuit. A sacrificial layer is formed on a surface portion of the first dielectric layer. A bonding layer is formed on the first dielectric layer such that the sacrificial layer is within the bonding layer.

The second semiconductor substrate and the bonding layer are bonded together. The second region of the second semiconductor substrate correspondingly covers the sacrificial layer. A plurality of first through-holes are formed through the first region of the second semiconductor substrate and through the bond layer to expose at least a surface portion of the first metal interconnect structure. An isolation layer is formed on a sidewall surface of each first through-hole and on a top surface of the second semiconductor substrate. A conductive material is filled in the each first through-hole to form a conductive plug on the first metal interconnect structure. A second metal interconnect structure including a first end formed through the isolation layer and on the first region of the second semiconductor substrate, and including a second end connected to an upper end of the conductive plug is formed. A plurality of second through-holes is formed through the second region of the second semiconductor substrate and through a top portion of the bonded layer that is on the sacrificial layer. The sacrificial layer is removed along the plurality of second through-holes to form a cavity under the top portion of the bonded layer to leave a movable electrode formed by the top portion of the bonded layer and a remaining portion of the second semiconductor substrate to form the MEMS device.

According to various embodiments, there is also provided a method of forming a MEMS device. A first semiconductor substrate and a second semiconductor substrate are provided. The first semiconductor substrate includes a CMOS control circuit and the second semiconductor substrate includes a first region and a second region, the second region being configured between adjacent first regions. A first metal interconnect structure is formed on the first semiconductor substrate and connected to the CMOS control circuit. A first dielectric layer is formed on the first semiconductor substrate. The first dielectric layer has a thickness greater than the first metal interconnect structure. A cavity is formed in the first dielectric layer.

The second semiconductor substrate and the first dielectric layer are bonded together. The second region of the second semiconductor substrate is correspondingly positioned to cover the cavity in the first dielectric layer. A plurality of first through-holes is formed passing through the first region of the second semiconductor substrate and the first dielectric layer to expose at least a surface portion of the first metal interconnect structure. An isolation layer is formed on a sidewall surface of each first through-hole and on a top surface of the second semiconductor substrate. A conductive material is filled in the Each first through-hole to form a conductive plug on the first metal interconnect structure. A second metal interconnect structure including a first end formed in the isolation layer and on the first region of the second semiconductor substrate, and including a second end connected to an upper end of the conductive plug is formed. A plurality of second through-holes is formed through the second region of the second semiconductor substrate and positioned on the cavity in the first dielectric layer to leave a movable electrode formed by a remaining portion of the second semiconductor substrate to form the MEMS device.

According to various embodiments, there is also provided a semiconductor device. The semiconductor device includes a first semiconductor substrate including a CMOS control circuit and a first dielectric layer disposed on the first semiconductor substrate. A first metal interconnect structure is disposed through the first dielectric layer, on the first semiconductor substrate, and connected to the CMOS control circuit. A bonding layer is disposed on the first dielectric layer. The bonding layer includes a cavity disposed on the first dielectric layer. A second semiconductor substrate is bonded with the bonding layer. The second semiconductor substrate includes a first region and a second region, the second region being between adjacent first regions and correspondingly covering the cavity. A conductive plug passes through the first region of the second semiconductor substrate, through the bonding layer, and on a surface portion of the first metal interconnect structure. An isolation layer is disposed between a sidewall of the conductive plug and the first region of the second semiconductor substrate, and disposed on a top surface of the second semiconductor substrate. The device further includes a second metal interconnect structure including a first end disposed in the isolation layer and on the first region of the second semiconductor substrate, and including a second end connected to an upper end of the conductive plug. A plurality of second through-holes are disposed through the second region of the second semiconductor substrate and through a top portion of the bonded layer that is on the cavity to leave a movable electrode including the top portion of the bonded layer and a remaining portion of the second semiconductor substrate of the MEMS device.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 14:
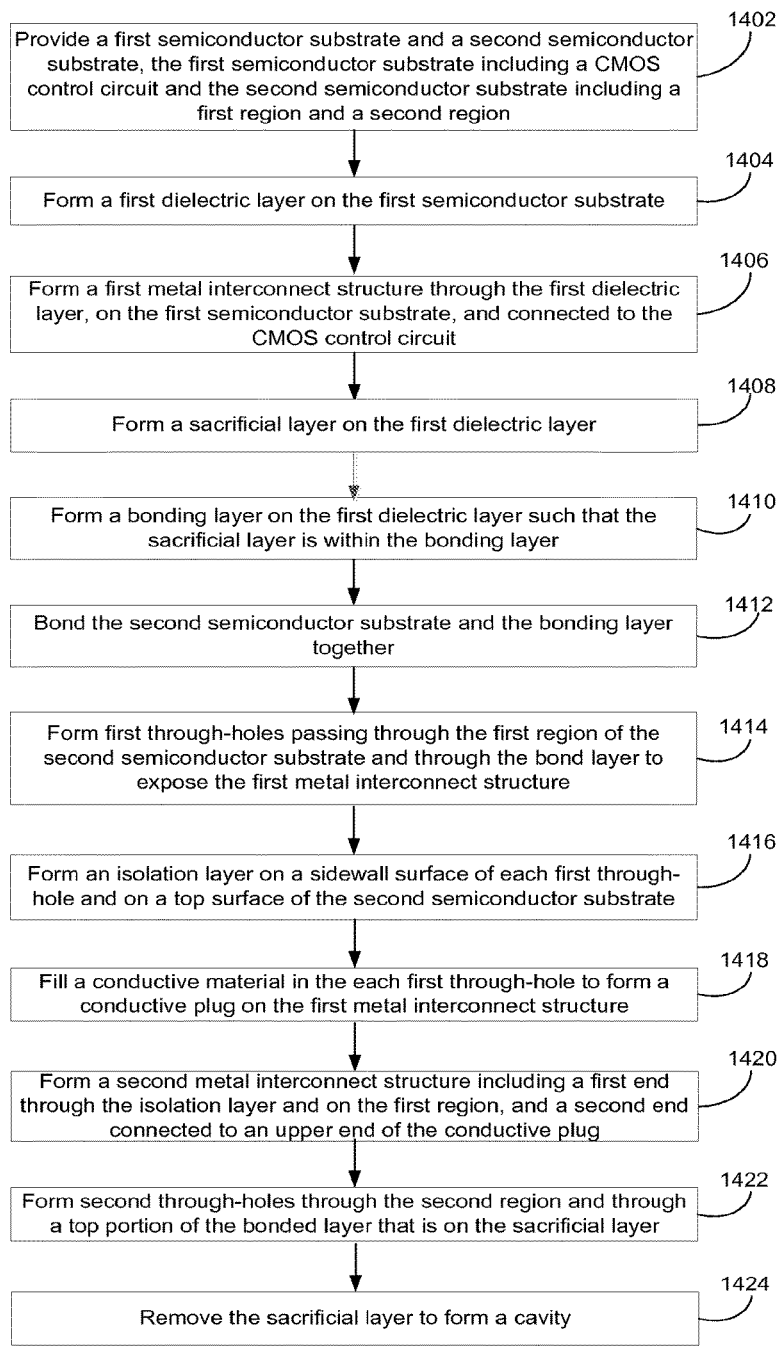
FIG. 14 depicts an exemplary method for forming an exemplary MEMS device in accordance with various disclosed embodiments.

FIGS. 1-8 depict cross-sectional views of an exemplary MEMS device at various stages during its formation in accordance with various disclosed embodiments. FIG. 14 depicts an exemplary method for forming an exemplary MEMS device in accordance with various disclosed embodiments.

Figure 1:
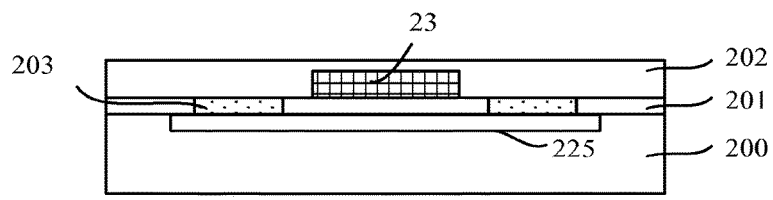
FIGS. 1-8 depict an exemplary MEMS device at various stages during formation in accordance with various disclosed embodiments.

In FIG. 1, a first semiconductor substrate 200 is provided (e.g., in Step 1402). A CMOS control circuit 225 is fabricated in the first semiconductor substrate 200. A first dielectric layer 201 is formed on the first semiconductor substrate 200. A first metal interconnect structure 203 is formed through an entire thickness of the first dielectric layer 201 and is electrically connected to the CMOS control circuit 225. A sacrificial layer 23 is formed on a surface portion of the first dielectric layer 201. A bonding layer 202 is formed on the first dielectric layer 201 having the sacrificial layer 23. The bonding layer 202 has a thickness such that the sacrificial layer 23 is disposed within the bonding layer 202.

The first semiconductor substrate 200 can be made of a material including silicon (Si), germanium (Ge), germanium-silicon (GeSi), and/or silicon carbide (SiC). In some embodiments, the first semiconductor substrate 200 can be made of a material including silicon on insulator (SOI), germanium on insulator (GOI), and/or other suitable materials, for example, a group III-V compound such as gallium arsenide. In an exemplary embodiment, the first semiconductor substrate 200 is made of single crystal silicon.

The CMOS control circuit 225 can be formed in the first semiconductor substrate 200, e.g., using known CMOS manufacturing process. The CMOS control circuit 225 can be used to provide control signal to the MEMS device, and to receive and process electrical signals generated from the MEMS device.

After forming the CMOS control circuit 225 in/on the first semiconductor substrate 200, the first dielectric layer 201 is formed on the first semiconductor substrate 200 (e.g., in Step 1404). The first dielectric layer 201 can be made of a material including silicon oxide, silicon nitride, low-k dielectric material, and/or other suitable materials.

The first metal interconnection structure 203 can be formed in the first dielectric layer 201 (e.g., in Step 1406). The first metal interconnect structure 203 can be electrically connected to the CMOS control circuit 225. The first metal interconnect structure 203 can be a single-layer of a metal interconnect layer. The first metal interconnect structure 203 can also include a metal plug and a metal interconnect layer. In other embodiments, a portion of the first metal interconnect structure 203 can be located on the first dielectric layer 201.

The sacrificial layer 23 can be formed by first forming a sacrificial thin-film on the first dielectric layer 201 and on the first metal interconnect structure 203. The sacrificial thin-film can then be patterned and etched by a photolithography process to leave a remaining sacrifice thin-film as the sacrificial layer 23 (e.g., in Step 1408). Subsequently, the sacrificial layer 23 can be removed to form a cavity for the MEMS device, followed by forming a movable electrode in the cavity.

In one embodiment, after forming the sacrificial layer 23, the bonding layer 202 can be formed to cover surfaces of the first dielectric layer 201 and the sacrificial layer 23 (e.g., in Step 1410). The sacrificial layer 23 is within the bonding layer 202. The sacrificial layer 23 has a thickness less than the bonding layer 202. When subsequently a second semiconductor substrate is bonded with the bonding layer 202, adhesion between the second semiconductor substrate and the bonding layer 202 can be tight.

The bonding layer 202 and sacrificial layer 23 can be made of materials having different etching selectivity. In one embodiment, the boding layer 202 can be made of silicon oxide and the sacrificial layer 23 can be made of amorphous carbon. The bonding layer 202 made of silicon oxide can subsequently enhance bonding efficiency and also adhesion when bonding the second substrate with the bonding layer 202. In addition, when removing the sacrificial layer 23 in a subsequent etching process, the bonding layer 202 may have a low etch rate to avoid damaging of the interface between the second semiconductor substrate and the bonding layer 202. It should be noted that the sacrificial layer 23 and the bonding layer 202 can be made of any other suitable materials without limitation.

The sacrificial layer 23 can have a thickness ranging from about 0.05 micron to about 50 microns, and a corresponding cavity formed thereafter can have a depth between 0.05 microns to 50 microns to meet requirements of the MEMS device. Accordingly, the bonding layer 202 can have a thickness greater than the sacrificial layer 23.

Figure 2:
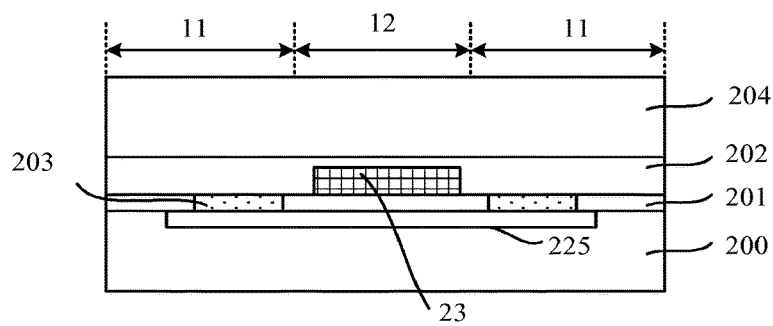

In FIG. 2, the second semiconductor substrate 204 is provided to be bonded together with the bonding layer 202 (e.g., in Steps 1402 and 1412).

The second semiconductor substrate 204 can include a first region 11 and second region 12. The second region 12 can be between adjacent first regions 11. After the bonding process, the second region 12 of the semiconductor substrate 204 can be positioned according to the position of the sacrificial layer 23. For example, the second region 12 of the semiconductor substrate 204 can be aligned (or positioned right above or having a same central axis) with the sacrificial layer 23. Subsequently, the second region 12 of the second semiconductor substrate 204 can be used to form a movable electrode of the MEMS device. The first region 11 of the second semiconductor substrate 204 can be used to form other components of the MEMS device. For example, conductive plugs can be subsequently formed in the first region 11 of the second semiconductor substrate 204.

The second semiconductor substrate 204 can be a whole wafer directly used for forming movable electrodes of the MEMS device. Compared with movable electrodes formed by a deposition process (for example, a movable polysilicon electrode may be deposited to have a maximum thickness of about 4 microns to about 10 microns), the second semiconductor substrate 204 can have a high thickness as desired. For example, when preparing the whole wafer, the second semiconductor substrate 204 can be controlled (e.g., thinned) to have a thickness of about 10 microns to about 200 microns. The disclosed second semiconductor substrate 204 can also provide thickness/surface uniformity with high density, which can be used to form the movable electrode with a sufficient thickness and a sufficient weight. Further the second semiconductor substrate 204 can be made of single crystal silicon. Single crystal silicon is known as having mechanical and electrical properties that are superior over the polycrystalline silicon. Therefore, the MEMS device made by the second semiconductor substrate 204 of single crystal silicon can have better life time and better electrical properties as compared with that made of polysilicon.

After a bonding process of the second semiconductor substrate 204 and the bonding layer 202, a thinning process can further be performed to the surface of the second semiconductor substrate 204. The thinning process can include a chemical mechanical polishing process. After thinning, the second semiconductor substrate 204 can have a thickness ranging from about 5 microns to about 50 microns, for example, about 5 microns, about 10 microns, about 20 microns, about 30 microns, about 40 microns, or about 45 microns.

In one embodiment, the second semiconductor substrate 204 and the bonding layer 202 can be bonded directly including, e.g., a fusion bonding process. In an exemplary bonding process, the surface to be bonded of each of the second semiconductor substrate 204 and the bonding layer 204 can be cleaned to remove oil contamination, impurities, particles, and/or any other possible materials that may affect the bonding process.

The surface to be bonded (or bonding surface) of each of the second semiconductor substrate 204 and the bonding layer 204 can then be treated by a plasma to increase amount of —OH bond and/or dangling bonds on the bonding surface of the second semiconductor substrate 204 and the bonding layer 202 to improve the bonding efficiency and the bonding adhesion there-between. The bonding process can further include bonding the second semiconductor substrate 204 and the bonding layer 202 at a room temperature (about 20° C.-25° C.) to form a bonded structure, which can then be annealed in an environment containing oxygen and/or nitrogen with an annealing temperature of less than or equal to about 400° C.

In one embodiment, after the bonding between the second semiconductor substrate 204 and the bonding layer 202, the bonding strength there-between can be about 10 Mpa or greater.

Figure 3:
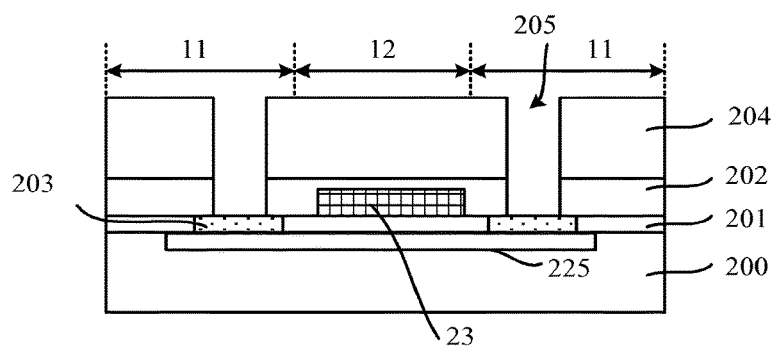

In FIG. 3, a plurality of first through-holes 205 is formed through the first regions 11 of the second semiconductor substrate 204 and through the bonding layer 202 (e.g., in Step 1414). Each first through-hole 205 can expose at least a surface portion of a corresponding first metal interconnect structure 203.

The first through-holes 205 can subsequently be filled with a conductive material to form a conductive plug for connecting the CMOS control circuit 225 with the MEMS components.

In one embodiment, each first through-hole 205 can have an inclined sidewall such that an opening of the first through-hole 205 has a width wider than a bottom of the first through-hole 205. For example, the inclined sidewall of the first through-hole 205 can have an angle made with a substrate surface of the first semiconductor substrate 200. Such angle can be between about 80° and about 90°, e.g., about 80°, about 82°, about 84°, about 85°, about 86°, and about 87°. The first through-hole 205 can have a depth that is sufficiently deep so that, when subsequently depositing an isolation layer material on the sidewall of the first through-hole 205 and when filling the through-hole with a first conductive material, the opening of the first through-hole 205 is not clogged by the deposited isolation layer material and the filled first conductive material.

The first through-holes can be formed by a plasma etching process using a source plasma power of about 800 W to about 1300 W, a bias power of about 200 W to about 400 W, an etching chamber pressure of about 5 mtorr to about 40 mtorr, and/or an the etching gas of HBr, SF6, and/or He.

The first through-hole 205 can be formed by the plasma etching process including a first etching process and a second etching process. The first etching process can be used to etch the first region 11 of the second semiconductor substrate 204 to form a first sub-through-hole in the second semiconductor substrate 204. Following the first etching process and through the first sub-through-hole, the second etching process can be used to etch the bonding layer 202 to form a second sub-through-hole in the bonding layer 202. The first sub-through-hole and the second sub-through-hole can constitute the first through-hole.

Figure 4:
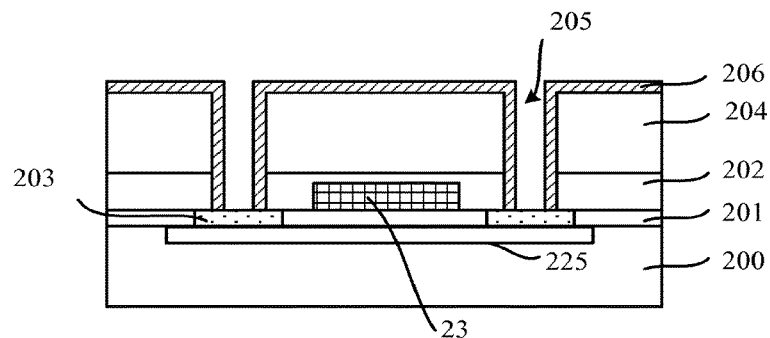

In FIG. 4, an isolation layer 206 is formed on sidewall surface of the first through-hole 205 and on the top surface of the second semiconductor substrate 204 (e.g., in Step 1416). The isolation layer 206 can expose at least a surface portion of the first metal interconnect structure 203.

The isolation layer 206 can be formed to subsequently provide electrical isolation between a conductive plug and the second semiconductor substrate 204 (or MEMS device), and/or provide electrical isolation between subsequently-formed second metal interconnect structures.

The isolation layer 206 can be formed, e.g., by a chemical vapor deposition, such as, a sub-atmospheric chemical vapor deposition (SACVD) or an atomic layer deposition. In one embodiment, the isolation layer 206 can be made of a material including silicon oxide. The isolation layer 206 can have a thickness (e.g., about 0.1 micron to about 2 microns) less than a radius of the first through-hole 205 to provide desired electrical isolation.

In one embodiment, when forming the isolation layer 206, an etching process can be performed to remove a portion of the isolation layer material that is deposited at the bottom of the through-hole to expose the underlying first metal interconnect structure 203. In various embodiments, a dielectric layer (not shown), e.g., a silicon oxide layer, can be formed on the isolation layer 206 to provide more isolation thickness on sidewall of the second semiconductor substrate 204 to facilitate isolation between the subsequently formed second metal interconnect structure in the first through-hole and the second semiconductor substrate 204.

In various embodiments, after forming the isolation layer 206, a barrier layer (not shown) can be formed on surface of the isolation layer to prevent metal diffusion from the subsequently filled metal material. The barrier layer can be a single layer or a stacked multilayer formed by one or more materials of Ti, TiN, Ta, TaN, and/or any suitable material.

Figure 5:
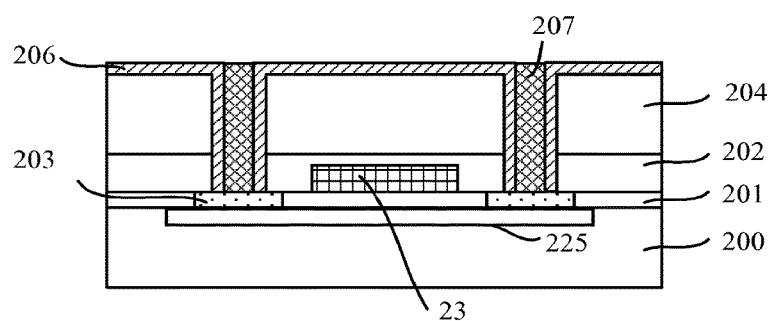

In FIG. 5, a conductive plug 207 is formed by filling the first through-hole 205 with a conductive material (e.g., in Step 1418). The conductive plug 207 can be connected to the first metal interconnect structure 203.

The conductive material can include, e.g., doped polysilicon, copper, aluminum, tungsten, and/or any other suitable conductive material(s). When the conductive plug is made of doped polysilicon, the process of filling the conductive material can be performed by an in-situ doped epitaxial process or any suitable deposition process. When the conductive plug is made of a metal, the filling process of the conductive material can be performed by an electr-plating process, physical vapor deposition, sputtering, and/or any suitable process.

During filling of the conductive material, the conductive material may also be deposited on a top surface of the isolation layer 206. The conductive material on the top surface of the isolation layer 206 can then be removed, e.g., by an etching process or a chemical mechanical polishing to expose the top surface of the isolation layer 206.

Figure 6:
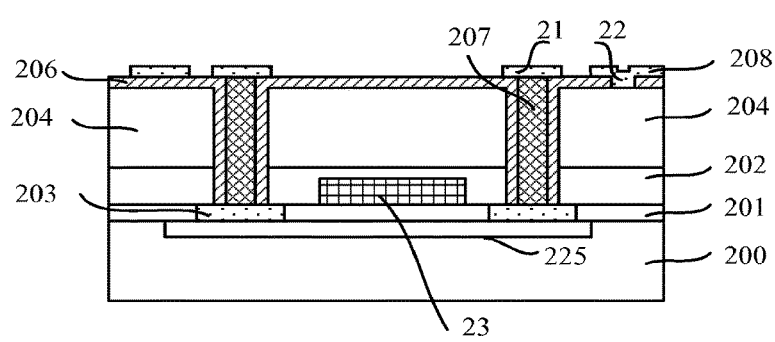

In FIG. 6, a second metal interconnect structure 208 is formed having a first end 22 connected to the first region 11 (e.g., connected to a MEMS device in the first region 11) of the second semiconductor substrate 204, and having a second end 21 connected to an upper end of the conductive plug 207 (e.g., in Step 1420).

The second metal interconnect structure 208 can be formed by a process including: forming an opening in the isolation layer 206 to expose a top surface portion of the underlying second semiconductor substrate 204. A metal layer can then be formed in the opening and on the top surface of the isolation layer 206. The metal layer can be etched to form the second metal interconnect structure 208 as shown in FIG. 6.

In one embodiment, the CMOS control circuit 225 can be connected to the MEMS components/device by: the second metal interconnect structure 208, the conductive plug 207, and the first metal interconnect structure 203. Compared with conventional wire bonding technology, the disclosed connection method using the second metal interconnect structure 208, the conductive plug 207, and the metal interconnect structure 203 can provide high degree of integration of the MEMES device and the CMOS ICs, with low contact resistance.

Figure 7:
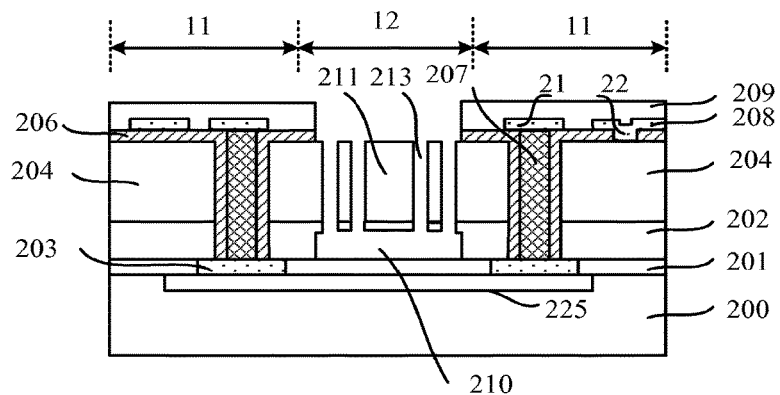

In FIG. 7, a plurality of second through-holes 213 is formed through the second region 12 of the second semiconductor substrate 204 and further through a top portion of the bonding layer 202 that are on the sacrificial layer 23 (e.g., in Step 1422). The second through-holes 213 can expose the underlying sacrificial layer 23. The sacrificial layer 23 can then be removed by an etching process through the second through-holes 213 to from a cavity 210 and a movable electrode 211 of the MEMS device (e.g., in Step 1424). The movable electrode 211 and the remainder of the second semiconductor substrate 204 together can form a MEMS component/device as shown in FIG. 7.

In one embodiment for form the second through-holes 213, a second dielectric layer material can be formed to cover the entire surface of the isolation layer 206 and the second metal interconnect structure 208 (e.g., as shown in FIG. 6). The second dielectric layer material can then be patterned (e.g., by a photolithography process) to form openings (e.g., corresponding to subsequently formed second through-holes, not shown) through the second dielectric layer material and the isolation layer 206, that are over the second region 12 of the second semiconductor substrate 204. Through such openings (e.g., used as a mask for another photolithography process), the second through-holes 213 can then be formed by etching the second semiconductor substrate 204 in the second region 12 and by etching a portion of the bonding layer 202. Then the sacrificial layer 23 under the second region 12 of the second semiconductor substrate 204 can be removed by etching through the second through-holes 213 to form the cavity 210 and to leave the movable electrode 211 to form the MEMS device.

In a specific embodiment, after forming the MEMS device including the movable electrode 211 and the cavity 210, the portion of the second dielectric layer material and the isolation layer 206, that are on the second region 12 of the second semiconductor substrate 204 and that include openings there-through, can be removed (e.g., as shown in FIG. 7) or retained (not shown, in this case, the second through-holes can include such openings and can be considered as passing through each of the second dielectric layer, the isolation layer, the second region 12 of the second semiconductor substrate 204, and the top portion of the bonding layer). In one embodiment, the sacrificial layer 23 can be removed by a wet etching process.

Figure 8:
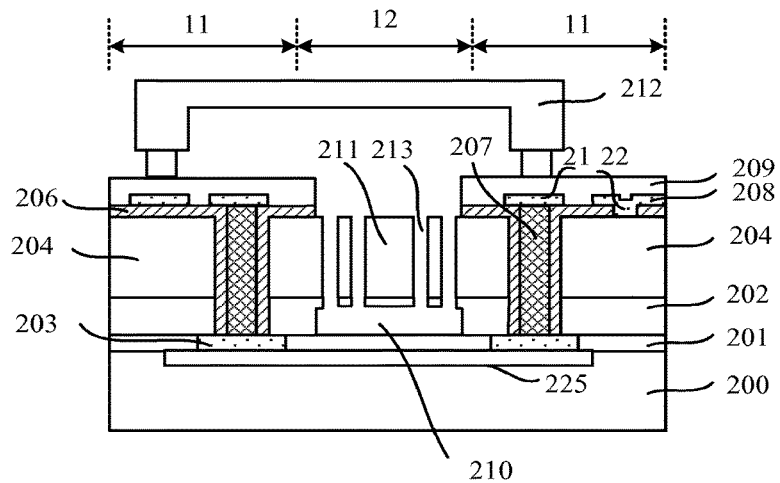

In FIG. 8, a capping layer 212 is formed on the second dielectric layer 209. The capping layer 212 can be used to seal the MEMS device including the cavity 210 and the movable electrode 211. The capping layer 212 can be formed by a bonding process. In one embodiment, the capping layer 212 can be formed having an n-shape spanning on the second dielectric layer 209 such that the capping layer, the second dielectric layer, the isolation layer, and the movable electrode form an upper cavity. The upper cavity is connected to the cavity formed in the bonding layer via the plurality of second through-holes.

In this manner, an exemplary MEMS device (e.g., as shown in FIG. 8) can include a first semiconductor substrate 200 including a CMOS control circuit 225. A first dielectric layer 201 can be disposed on the first semiconductor substrate 200. The first dielectric layer 201 can include first metal interconnect structures 203 which are connected to CMOS control circuit 225. A bonding layer 202 can be disposed on the first dielectric layer 201. The bonding layer 202 can include a cavity 210 within the bonding layer 202. A second semiconductor substrate 204 can be bonded with the bonding layer 202. The second semiconductor substrate 204 can include first regions 11 and a second region 12. A movable electrode 211 can be formed in the second region 12 of the second semiconductor substrate 204 located above the cavity 210.

A plurality of first through-holes are disposed through the first region 11 of the second semiconductor substrate 204 and through the bonding layer 202 to expose at least a surface portion of the first metal interconnect structure 203. An isolation layer is formed on sidewall of the first through-holes and on a top surface portion of the semiconductor substrate 204. A conductive plug 207 can fill the first through-holes and a lower end of the conductive plug 207 can be connected to the first metal interconnect structure 203. A second metal interconnect structure 208 can be formed having a first end 22 connected to the first region 11 (e.g., connected to a MEMS device in the first region 11) of the second semiconductor substrate 204, and having a second end 21 connected to an upper end of the conductive plug 207.

A second dielectric layer 209 can be formed on the isolation layer 206 and on the second metal interconnect structure 208. A capping layer 212 can be formed having an n-shape spanning on the second dielectric layer 209 such that the capping layer, the second dielectric layer, the isolation layer, and the movable electrode form an upper cavity. The upper cavity is connected to the cavity formed in the bonding layer via the plurality of second through-holes.

Figure 15:
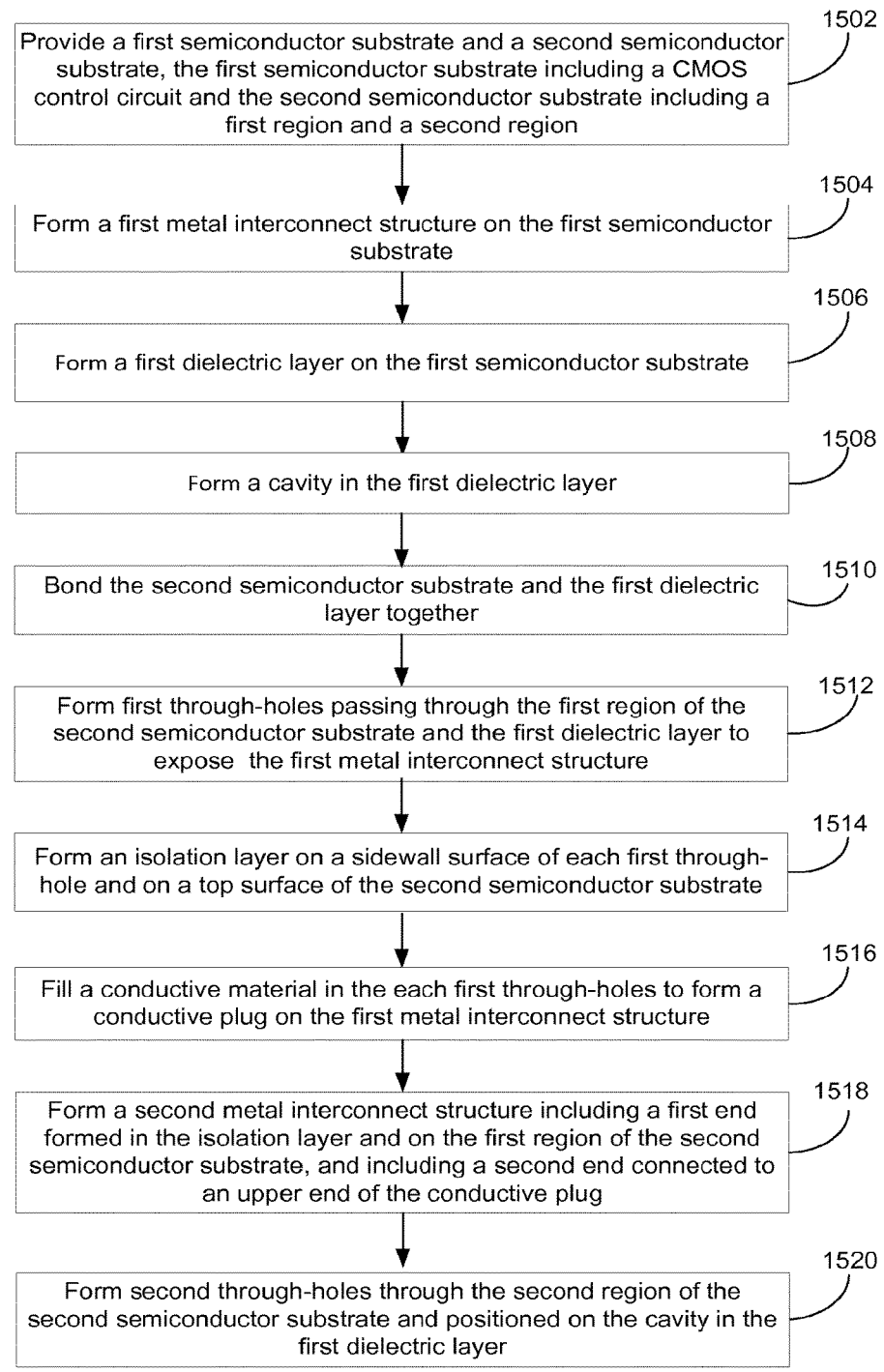
FIG. 15 depicts another exemplary method for forming an exemplary MEMS device in accordance with various disclosed embodiments.

FIGS. 9-13 depict cross-sectional views of another exemplary MEMS device at various stages during its formation in accordance with various disclosed embodiments. FIG. 15 depicts another exemplary method for forming an exemplary MEMS device in accordance with various disclosed embodiments. Note that the exemplary MEMS device depicted in FIGS. 9-13 may have parts/structures and/or their methods that are similar or same to the exemplary MEMS device depicted in FIGS. 1-8. In this case, detailed description can be referred to one another without limitation.

Figure 9:
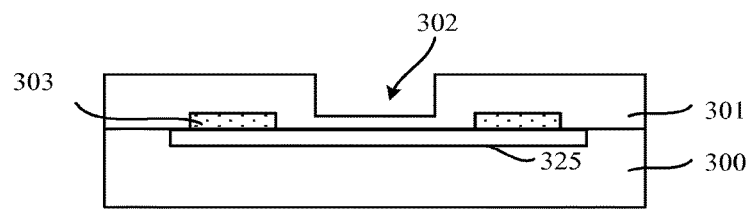
FIGS. 9-13 depict another exemplary MEMS device at various stages during formation in accordance with various disclosed embodiments.

In FIG. 9, a first semiconductor substrate 300 is provided having a CMOS control circuit 325 (e.g., in Step 1502). A first metal interconnect structure 303 is formed on the first semiconductor substrate 300 and is connected to the CMOS control circuit 325 (e.g., in Step 1504). A first dielectric layer 301 is formed on the first semiconductor substrate 300 and the first metal interconnect structure 303 (e.g., in Step 1506). The first metal interconnect structure 303 is within the first dielectric layer 301. The first dielectric layer 301 can include an opening or a cavity 302 (e.g., in Step 1508).

The first dielectric layer 301 can be made of a material including silicon oxide, and/or other suitable dielectric material. The first dielectric layer 301 can have a thickness greater than the first metal interconnect structure 303 by about 0.05 microns to about 5 microns. That is, a thickness portion of the first dielectric layer 301 above the first metal interconnect structure 303 can be about 0.05 microns to about 5 microns. For forming the first metal interconnect structure 303, a dielectric material layer can be formed on the first semiconductor substrate 300, followed by forming the first metal interconnect structure 303 in the dielectric material layer. Such dielectric material layer can be a portion of the dielectric layer 301. For example, one or more additional dielectric material layer(s) can be formed on that dielectric material layer to form the dielectric layer 301.

The cavity 302 can be positioned according to a second region of a second semiconductor substrate to be subsequently bonded to the dielectric layer 301. The cavity 302 can have a depth ranging from about 0.05 microns to about 5 microns. In one embodiment, the cavity 302 in the first dielectric layer 301 can have a bottom surface higher than or coplanar with a top surface of the first metal interconnect structure 303. In other embodiments, the bottom surface of the cavity can be lower than the first metal interconnect structure 303, or can be located in the first semiconductor substrate.

Figure 10:
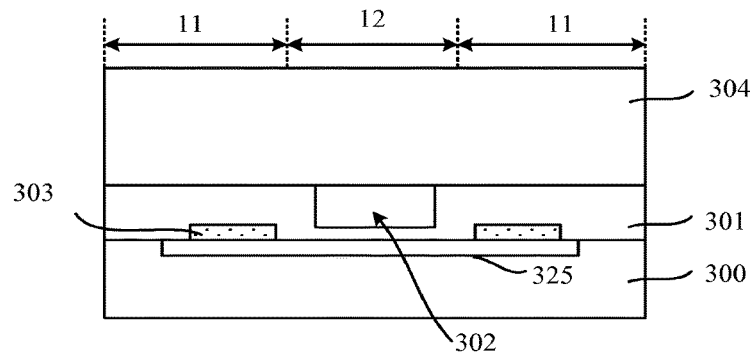

In FIG. 10, a second semiconductor substrate 304 is provided (e.g., in Step 1502). The second semiconductor substrate 304 includes a first region 11 and a second region 12. The second semiconductor substrate 304 and the first dielectric layer 301 can be bonded together (e.g., in Step 1510). In various embodiments, the second semiconductor substrate 304 can be the same or similar to the second semiconductor substrate 204 as disclosed herein.

Figure 11:
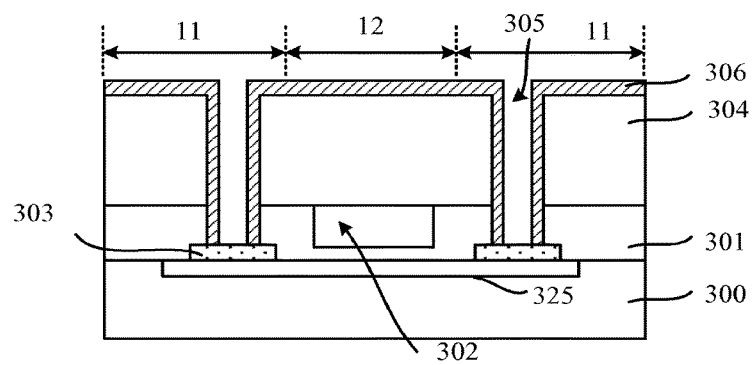

In FIG. 11, a first through-hole 305 is formed through the first region 11 of the second semiconductor substrate 304 and in the first dielectric layer 301 to expose the first metal interconnect structure 303 (e.g., in Step 1512). An isolation layer 306 is formed on top surface of the semiconductor substrate 304 and on the sidewall surface of the first through-holes 305 (e.g., in Step 1514). In one embodiment, the isolation layer 306 can be made of silicon oxide. In various embodiments, the isolation layer 306 can be the same or similar to the isolation layer 206 as disclosed herein.

Figure 12:
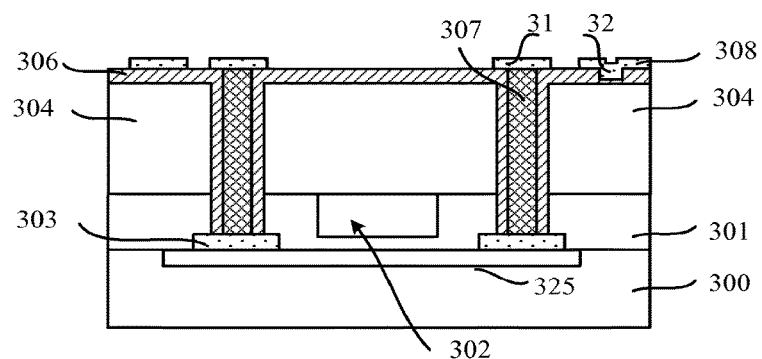

In FIG. 12, a conductive plug 307 is formed by filling the first through-hole 305 with a conductive material (e.g., in Step 1516). A lower end of the conductive plug 307 is connected with the first metal interconnect structure 303. A second metal interconnect structure 308 is formed in the isolation layer 306. The second metal interconnect structure 308 can have an end 32 connected to the first region of the second semiconductor substrate 304 and can have another end connected to the upper end of the conductive plug 307.

Figure 13:
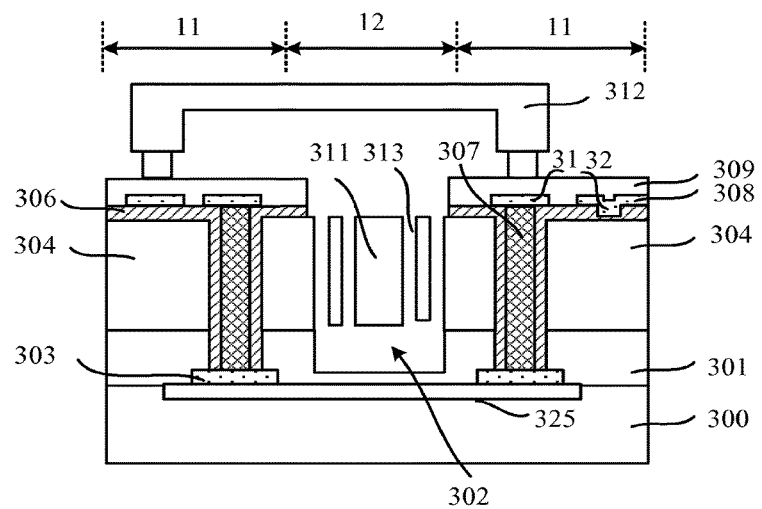

In FIG. 13, a plurality of second through-holes 313 is formed through the second region of the second semiconductor substrate 304 to leave a movable electrode 311 to form the MEMS device (e.g., in Step 1520). The movable electrode 311 is located above the cavity 302. A second dielectric layer 309 can be formed on the isolation layer 306 and on the second metal interconnect structure 308. A capping layer 312 is formed on the second dielectric layer 309 to enclose an upper cavity with the movable electrode 311. The upper cavity is connected to the cavity 302 by the second through-holes 313.

Various embodiments thus provide another exemplary MEMS device (e.g., as shown in FIG. 13). The exemplary MEMS device can include: a first semiconductor substrate 300 including a CMOS control circuit 325 configured therein. A first metal interconnect structure 303 is formed on the first semiconductor substrate 300 and connected to the CMOS control circuit 325. A first dielectric layer 301 is formed on surface of the first metal interconnect structure 303 and the first semiconductor substrate 300. The first dielectric layer 301 includes a cavity 302. A second semiconductor substrate 304 including a first region 11 and second region 12 are bonded with the first dielectric layer 301. A movable electrode 311 is formed in the second region 12 of the second semiconductor substrate 304 and located above the cavity 302 in the first dielectric layer 301. First through-holes are formed through the first region 11 of the second semiconductor substrate 304 and in the first dielectric layer 301 to expose at least a surface portion of the first metal interconnect structure 303. An isolation layer 306 is formed on sidewalls of the first through-holes and on surface of the second semiconductor substrate 304. A conductive plug 307 fills the first through-holes and has a lower end on the first metal interconnect structure 303. A second metal interconnect structure 308 is formed in the isolation layer 306. The second metal interconnect structure 308 has a first end 32 connected to the first region of the second semiconductor substrate 304 and has a second end 31 connected to an upper end of the conductive plug 307. A second dielectric layer 309 can be formed on the isolation layer 306 and on the second metal interconnect structure 308. A capping layer 312 is formed on the second dielectric layer 309 to enclose an upper cavity with the movable electrode 311. The upper cavity is connected to the cavity 302 by the second through-holes 313.

In this manner, a first semiconductor substrate including a CMOS control circuit and a second semiconductor substrate including a MEMS component/device can be bonded together. The MEMS device can include a movable electrode formed between an upper cavity and a lower cavity (e.g., 210 or 302 in FIGS. 1-13). Degree of integration of the MEMS device can be improved. Further, by forming first through-holes in the second semiconductor substrate and forming a conductive plug in each first through-hole, the MEMS device and the CMOS control circuit can be electrically connected with one another through the conductive plug, a first metal interconnect structure, and a second metal interconnect structure. Contact resistance can be reduced and degree of integration of the MEMS device can be further improved.

In addition, the first through-holes can be sufficiently deep and the sidewall of the first through-holes can be inclined to provide an opening wider than a bottom surface of the first through-hole. When depositing the isolation layer material and/or filling the conductive material, the first through-holes may not be clogged at the opening of the through-holes.

In various embodiments, the MEMS device can include any MEMS device such as any active sensors. Through-holes can be made by DRIE. Inter metal connection can be provided with low contact resistance and small size. A CMP process can be performed after filling the conductive material in the through-holes.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method of forming a MEMS device, comprising:
providing a first semiconductor substrate and a second semiconductor substrate, wherein the first semiconductor substrate includes a CMOS control circuit and the second semiconductor substrate includes a first region and a second region, the second region being configured between adjacent first regions;
forming a first metal interconnect structure on the first semiconductor substrate, the first metal interconnect structure connected to the CMOS control circuit;
forming a first dielectric layer on the first semiconductor substrate, wherein the first dielectric layer has a thickness greater than the first metal interconnect structure;
forming a cavity in the first dielectric layer;
bonding the second semiconductor substrate and the first dielectric layer together, the second region of the second semiconductor substrate correspondingly positioned to cover the cavity in the first dielectric layer;
forming a plurality of first through-holes passing through the first region of the second semiconductor substrate and the first dielectric layer to expose at least a surface portion of the first metal interconnect structure;
forming an isolation layer on a sidewall surface of each first through-hole and on a top surface of the second semiconductor substrate;
filling a conductive material in the each first through-hole to form a conductive plug on the first metal interconnect structure;
forming a second metal interconnect structure including a first end formed through the isolation layer and on the first region of the second semiconductor substrate, and including a second end connected on an upper end of the conductive plug being coplanar with a top surface of the isolation layer; and
forming a plurality of second through-holes through the second region of the second semiconductor substrate and positioned on the cavity in the first dielectric layer to leave a movable electrode formed by a remaining portion of the second semiconductor substrate to form the MEMS device.

2. The method according to claim 1, further including:
forming a second dielectric layer on the isolation layer and on the second metal interconnect structure; and
forming a capping layer having an n-shape spanning on the second dielectric layer, wherein the capping layer, the second dielectric layer, the isolation layer, and the movable electrode form an upper cavity, the upper cavity connected to the cavity formed in the first dielectric layer via the plurality of second through-holes.

3. The method according to claim 1, further including:
thinning the second semiconductor substrate prior to the bonding process, wherein a thinned second semiconductor substrate has a thickness ranging from about 5 microns to about 50 microns.

4. The method according to claim 1, wherein the cavity in the first dielectric layer has a depth ranging from about 0.05 microns to about 5 microns.

5. The method according to claim 1, wherein the first dielectric layer has the thickness greater than the first metal interconnect structure by about 0.05 microns to about 5 microns.

6. The method according to claim 1, wherein the sidewall surface of the each first through-hole is inclined to have an opening wider than a bottom surface of the each first through-hole, and wherein the sidewall surface of the first through-hole has an angle made with a surface of the first semiconductor substrate of about 80 degrees to about 90 degrees.

7. A MEMS device formed by the method according to claim 1, wherein the MEMS device is electrically connected to the CMOS control circuit by the conductive plug passing through the second semiconductor substrate.

8. The method according to claim 1, wherein the conductive plug includes doped polysilicon, copper, aluminum, tungsten, and a combination thereof.

9. The method according to claim 1, wherein each of the first and second semiconductor substrates includes a single crystal silicon semiconductor.

10. The method according to claim 1, wherein the remaining portion of the second semiconductor substrate is in contact with and on the top portion of the bonded layer.

11. The method according to claim 1, wherein the cavity has a bottom surface higher than or coplanar with a top surface of the first metal interconnect structure.

12. The method according to claim 1, wherein the MEMS device and the CMOS control circuit are electrically connected through the conductive plug, the first metal interconnect structure, and the second metal interconnect structure.

13. A method of forming a MEMS device, comprising:
providing a first semiconductor substrate and a second semiconductor substrate, wherein the first semiconductor substrate includes a CMOS control circuit and the second semiconductor substrate includes a first region and a second region, the second region being configured between adjacent first regions;
forming a first metal interconnect structure on the first semiconductor substrate, the first metal interconnect structure connected to the CMOS control circuit;
forming a first dielectric layer on the first semiconductor substrate, wherein the first dielectric layer has a thickness greater than the first metal interconnect structure;
forming a cavity in the first dielectric layer;
bonding the second semiconductor substrate and the first dielectric layer together, the second region of the second semiconductor substrate correspondingly positioned to cover the cavity in the first dielectric layer;
forming a plurality of first through-holes passing through the first region of the second semiconductor substrate and the first dielectric layer to expose at least a surface portion of the first metal interconnect structure;
forming an isolation layer on a sidewall surface of each first through-hole and on a top surface of the second semiconductor substrate;
filling a conductive material in the each first through-hole to form a conductive plug on the first metal interconnect structure;
forming a second metal interconnect structure including a first end formed in the isolation layer and on the first region of the second semiconductor substrate, and including a second end connected to an upper end of the conductive plug; and
forming a plurality of second through-holes through the second region of the second semiconductor substrate and positioned on the cavity in the first dielectric layer to leave a movable electrode formed by a remaining portion of the second semiconductor substrate to form the MEMS, wherein the second metal interconnect structure has a flat bottom surface connected to a coplanar upper end of the conductive plug and a top surface of the isolation layer.

14. The method according to claim 13, further including:
thinning the second semiconductor substrate prior to the bonding process.

15. The method according to claim 13, further including:
forming a second dielectric layer on the isolation layer and on the second metal interconnect structure; and
forming a capping layer having an n-shape spanning on the second dielectric layer, wherein the capping layer, the second dielectric layer, the isolation layer, and the movable electrode form an upper cavity, the upper cavity is connected to the cavity formed in the first dielectric layer via the plurality of second through-holes.

16. The method according to claim 13, wherein the cavity has a bottom surface higher than or coplanar with a top surface of the first metal interconnect structure.

17. The method according to claim 13, wherein the MEMS device and the CMOS control circuit are electrically connected through the conductive plug, the first metal interconnect structure, and the second metal interconnect structure.

18. The method according to claim 13, wherein the sidewall surface of the each first through-hole is inclined to have an opening wider than a bottom surface of the each first through-hole.

19. A device, comprising:
a first semiconductor substrate including a CMOS control circuit, a cavity being formed in the first semiconductor substrate;
a second semiconductor substrate including an MEMS device, the second semiconductor substrate including a first region and a second region, the second region being configured between adjacent first regions, the second semiconductor substrate being boned with the first semiconductor substrate;
a conductive plug electrically connecting the MEMS device and the CMOS control circuit; and
a movable electrode formed in the second semiconductor substrate above the cavity of the first semiconductor substrate to form the MEMS device,
wherein the conductive plug is formed by:
forming a first metal interconnect structure on the first semiconductor substrate, the first metal interconnect structure connected to the CMOS control circuit;
forming a first dielectric layer on the first semiconductor substrate;
bonding the second semiconductor substrate and the first dielectric layer together, the second region of the second semiconductor substrate correspondingly positioned to cover the cavity in the first dielectric layer;
forming a plurality of first through-holes passing through the first region of the second semiconductor substrate and the first dielectric layer to expose at least a surface portion of the first metal interconnect structure;
forming an isolation layer on a sidewall surface of each first through-hole and on a top surface of the second semiconductor substrate;
filling a conductive material in the each first through-hole to form the conductive plug on the first metal interconnect structure;
forming a second metal interconnect structure including a first end formed through the isolation layer and on the first region of the second semiconductor substrate, and including a second end connected on an upper end of the conductive plug being coplanar with a top surface of the isolation layer.

20. The device according to claim 19, wherein the movable electrode is formed by:
forming a plurality of second through-holes through the second region of the second semiconductor substrate and positioned on the cavity in the first dielectric layer to leave the movable electrode formed by a remaining portion of the second semiconductor substrate to form the MEMS device.

* * * * *